(12) United States Patent
Yoshida

(10) Patent No.: US 7,282,785 B2
(45) Date of Patent: Oct. 16, 2007

(54) SURFACE MOUNT TYPE SEMICONDUCTOR DEVICE AND LEAD FRAME STRUCTURE THEREOF

(75) Inventor: Kenichi Yoshida, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/939,972

(22) Filed: Sep. 14, 2004

(65) Prior Publication Data

US 2005/0151231 A1 Jul. 14, 2005

(30) Foreign Application Priority Data

Jan. 5, 2004 (JP) .............................. 2004-000042

(51) Int. Cl.
*H01L 23/48* (2006.01)

(52) U.S. Cl. .................... 257/666; 257/81; 257/99; 257/E33.056

(58) Field of Classification Search ................ 257/666, 257/81, 95, 99, E23.031, E33.056; 438/22, 438/24
See application file for complete search history.

(56) References Cited

U.S. PATENT DOCUMENTS

| | | | |
|---|---|---|---|
| 5,521,429 A * | 5/1996 | Aono et al. ................ 257/676 |
| 6,066,861 A | 5/2000 | Hohn et al. ................ 257/99 |
| 6,245,259 B1 | 6/2001 | Hohn et al. ............ 252/301.36 |
| 6,277,301 B1 | 8/2001 | Hohn et al. ............ 252/301.36 |
| 6,376,902 B1 | 4/2002 | Arndt ........................ 257/678 |
| 6,459,130 B1 | 10/2002 | Arndt et al. ................ 257/432 |
| 6,469,321 B2 | 10/2002 | Arndt .......................... 257/82 |
| 6,573,580 B2 | 6/2003 | Arndt ......................... 257/433 |
| 6,576,930 B2 | 6/2003 | Reeh et al. .................. 257/98 |
| 6,624,491 B2 * | 9/2003 | Waitl et al. ................. 257/434 |
| 6,669,866 B1 | 12/2003 | Kummer et al. ........ 252/301.4 R |
| 6,759,733 B2 | 7/2004 | Arndt ......................... 257/672 |
| 6,770,498 B2 * | 8/2004 | Hsu .............................. 438/26 |
| 6,774,401 B2 | 8/2004 | Nakada et al. .............. 257/82 |
| 6,812,503 B2 * | 11/2004 | Lin et al. ..................... 257/99 |
| 6,822,265 B2 * | 11/2004 | Fukasawa et al. ........... 257/81 |
| 6,847,116 B2 * | 1/2005 | Isokawa ..................... 257/736 |
| 6,888,231 B2 * | 5/2005 | Maeda ....................... 257/678 |
| 6,927,469 B2 | 8/2005 | Arndt et al. ............... 257/432 |

(Continued)

FOREIGN PATENT DOCUMENTS

EP 1 022 787 5/2003

*Primary Examiner*—Eugene Lee
(74) *Attorney, Agent, or Firm*—Cermak Kenealy & Vaidya LLP

(57) ABSTRACT

A surface mount type semiconductor device can be configured to include a pair of lead frames that are butted to each other with a spacing such that ends of the lead frames are opposite to each other. A bare chip can be mounted on a chip mount portion on one end side of one of the lead frames, and wire-bonded to a connection portion on an end side of the other lead frame. A housing can be insert-molded to an end side of both of the lead frames, and the lead frames can be shaped such that they extend along the side and bottom surfaces of the housing and form surface mounting terminal portions. The lead frames are preferably formed to be thin at least at the regions that are to be bent, and other regions thereof are preferably formed to be thick to improve heat radiating effect.

20 Claims, 6 Drawing Sheets

U.S. PATENT DOCUMENTS

2003/0038292 A1* 2/2003 Wang et al. .................. 257/81
2003/0071365 A1* 4/2003 Kobayakawa et al. ...... 257/787
2003/0075724 A1* 4/2003 Wang et al. .................. 257/99
2005/0045899 A1* 3/2005 Tsutsui ........................ 257/99
2005/0127387 A1* 6/2005 Chang ......................... 257/99

* cited by examiner

SURFACE MOUNT TYPE SEMICONDUCTOR DEVICE AND LEAD FRAME STRUCTURE THEREOF

This invention claims the benefit of Japanese patent application No. 2004-000042, filed on Jan. 5, 2004, which is hereby incorporated by reference.

FIELD OF THE INVENTION

The present invention relates to a surface mount type semiconductor device. More specifically, this invention relates to a surface mount type semiconductor device that can include a bare chip mounted on a lead frame arranged on a substrate, and to a lead frame structure thereof.

DESCRIPTION OF THE RELATED ART

A surface mount type semiconductor device such as a surface mount type LED has conventionally been configured as shown in FIGS. 4 to 6. In FIGS. 4 and 5, a surface mount type LED 1 includes a pair of lead frames 2 and 3, an LED chip 4 mounted on the lead frame 2, a hollow lamphouse 5 insert-molded to the lead frames 2 and 3 and a sealing resin 6 filled into a hollow portion 5a of the lamphouse 5.

The lead frames 2 and 3, are each made of a conductive material such as iron- or copper-based metal, and are provided with surface mounting terminal portions 2a and 3a that are exposed on the bottom and side surfaces of the lamphouse 5.

The lead frame 2 is further provided with a chip mount portion 2b exposed inside the hollow portion 5a at the center region of the lamphouse 5, whereas the lead frame 3 is provided with a connection portion 3b adjacent to the chip mount portion 2b and exposed inside the hollow portion 5a of the lamphouse 5.

It is to be noted that the chip mount portion 2b and the connection portion 3b of the lead frames 2 and 3 are adjacent to each other such that they are opposite to each other with a spacing, for example, of approximately 0.2 mm or less. The terminal portions 2a and 3a are respectively formed continuously from the chip mount portion 2b and the connection portion 3b.

The LED chip 4 has its bottom surface die-bonded to the chip mount portion 2b of the lead frame 2 and its front surface (top surface in FIG. 4) wire-bonded to the connection portion 3b of the adjacent lead frame 3 via a gold wire 4a.

The lamphouse 5 is insert-molded to the lead frames 2 and 3 by, for example, resin, and is provided with the hollow portion 5a that is open upward. This allows the inner surface of the hollow portion 5a of the lamphouse 5 to constitute a reflecting frame for the LED chip 4.

Within the hollow portion 5a, the chip mount portion 2b of the lead frame 2 and the connection portion 3b of the lead frame 3 are exposed. The sealing resin 6, made of a silicon-based thermosetting resin, etc., is filled into the hollow portion 5a of the lamphouse 5 and hardened.

It is to be noted that the lead frames 2 and 3 are subjected to forming after the sealing resin 6 is filled and hardened, thus forming the terminal portions 2a and 3a.

The lead frames 2 and 3 have complex shapes as shown in FIG. 5 partly to take as many of the lead frames 2 and 3 as possible from a flat plate material in the manufacture of the chip LED 1 thus configured. For this reason, the individual lead frames 2 and 3 are not set in a mold for insert-molding of the lamphouse 5. Instead, the mutually and integrally molded lead frames 2 and 3 are set in a mold for insert-molding of the lamphouse 5.

This eliminates the need to accurately position each of the lead frames 2 and 3 within the mold. In addition, positioning the integral lead frames 2 and 3 within the mold allows accurate positioning of the lead frames 2 and 3 relative to each other.

According to the chip LED 1 thus manufactured, when a drive voltage is applied to the LED chip 4 from the terminal portions 2a and 3a of the lead frames 2 and 3, the LED chip 4 emits light. This light is reflected by the inner surface of the hollow portion 5a of the lamphouse 5 and is simultaneously emitted externally through the sealing resin 6, thus being radiated upward.

For the chip LED 1 having such a configuration, incidentally, after the product size is determined, the areas of the lead frames 2 and 3 can be roughly determined, and it is preferred that the areas of the lead frames 2 and 3 be as small as possible in consideration of adhesion between the sealing resin 6 and the lamphouse 5.

To improve the heat radiating property of the lead frames 2 and 3, therefore, the volumes of the lead frames 2 and 3 could be increased by increasing their thicknesses as shown in FIG. 6 without increasing their areas.

However, increasing the thicknesses of the lead frames 2 and 3 leads to a relatively large stress acting on the lamphouse 5 during forming of the lead frames 2 and 3, which can possibly crack or otherwise damage the lamphouse 5 under certain circumstances.

In addition, the spacing between the mutually-opposing end surfaces of the lead frames 2 and 3 must be wider than the thicknesses of the lead frames 2 and 3 for lead frame manufacturing reasons, resulting in a large-sized package for the LED 1.

Such problems are not limited to the aforementioned surface mount type LED. The same problems are apparent in other surface mount type semiconductor devices such as devices that generate heat during operation, namely, semiconductor laser devices, various ICs, etc.

SUMMARY OF THE INVENTION

In accordance with one of several aspects of the present invention, a simple configuration is provided for a surface mount type semiconductor device and lead frame structure thereof for, among other reasons, improving the heat radiating property of the lead frames and reducing stress during forming of the lead frames. The surface mount type semiconductor device can include a pair of lead frames that are butted to each other with a spacing such that one end of the lead frames are opposite to each other. A bare chip can be mounted on a chip mount portion on one end side of one of the lead frames and wire-bonded to a connection portion on one end side of the other lead frame. A housing is preferably insert-molded to one end sides of both of the lead frames. The lead frames can be shaped by forming so as to extend along the side and bottom surfaces of the housing and to form surface mounting terminal portions. The lead frames are also preferably formed such that they are thin at least at the regions to be bent during forming, with other regions thereof formed to be thick to improve heat radiating effect.

In the surface mount type semiconductor device of the present invention it is preferred that the lead frames be thinly formed at the regions of the mutually-opposing end surfaces on the rear surface side. In addition, the lead frames are preferably provided with stepped portions at the regions of the mutually-opposing end surfaces on the rear surface side.

Further, the lead frames are preferably provided with sloped portions at the regions of the mutually-opposing end surfaces on the rear surface side.

According to another aspect of the present invention a lead frame structure of a surface mount type semiconductor device can include a pair of lead frames that are butted to each other with a spacing such that one end of the lead frames are opposite to each other. A bare chip can be mounted on a chip mount portion on one end side of one of the lead frames and wire-bonded to a connection portion on one end side of the other lead frame. A housing can be insert-molded to one end side of both of the lead frames, wherein the lead frames can be shaped by forming so as to extend along the side and bottom surfaces of the housing and to form surface mounting terminal portions. The lead frames are preferably formed such that they are thin at least at the regions to be bent during forming, with other regions thereof formed such that they are thick to improve heat radiating effect.

It is preferred that the lead frames be thinly formed at the regions of the mutually-opposing end surfaces on the rear surface side. The lead frames are preferably provided with stepped portions at the regions of the mutually-opposing end surfaces on the rear surface side. The lead frames are also preferably provided with sloped portions at the regions of the mutually-opposing end surfaces on the rear surface side.

The exposed portions on the side and bottom surfaces of the housing of the lead frames can be connected to the connection land on the mount substrate by surface mounting the semiconductor device. The bare chip can be powered from both lead frames, thus putting the bare chip into operation.

In this case, the individual lead frames can be formed to be thick as a whole, thus boosting their volumes. This can secure a sufficient volume for the individual lead frames even if the semiconductor package is small in size, and therefore the lead frames can be relatively small in area. This can lead to improvements in heat radiating effect of the lead frames, thus efficiently radiating heat generated during the operation of the bare chip mounted on the chip mount portion of one of the lead frames.

The lead frames can be thinly formed at the regions that are to be bent during forming, keeping stress that occurs during forming relatively small and considerably reducing the likelihood of cracking or otherwise damaging the housing that is molded to the lead frames.

If the lead frames are thinly formed at the regions of the mutually-opposing end surfaces on the rear surface side and, more specifically, if the lead frames are provided with stepped or sloped portions at the regions of the mutually-opposing end surfaces on the rear surface, the butt thickness of the lead frames at the mutually-opposing end surfaces will diminish. Thus, it is possible, even when a spacing that is wider than the butt thickness is secured, to reduce the spacing between the mutually-opposing end surfaces of the lead frames and further downsize the package of the surface mount type semiconductor device. Thus, the lead frames can be formed to be thick as a whole, boosting the volumes of the lead frames and improving their heat radiating property.

According to another aspect of the invention, A surface mount type semiconductor device can include a pair of lead frames having a first end and a second end that are spaced from each other and that are butted opposite to each other, the first end having a chip mount portion and the second end having a connection portion. A chip can be mounted on the chip mount portion and wire-bonded to the connection portion. A housing is preferably molded to the lead frames, wherein the lead frames are shaped such that they extend along a bottom surface of the housing and form surface mounting terminal portions. The lead frames can be thinner at least at regions that are bent, and are relatively thicker at other regions.

According to yet another aspect of the invention, a lead frame structure can include a pair of lead frames that have a first end and a second end and that are butted to each other with a spacing such that the first and second ends of the lead frames are located opposite to each other. The lead frames can include a chip mount portion located at the first end of the lead frames, and a connection portion located at the second end of the lead frames. A chip can be mounted on the chip mount portion and wire-bonded to the connection portion. A housing can be located adjacent to the lead frames, wherein the lead frames include bent regions such that the lead frames extend along a bottom surface of the housing and include surface mounting terminal portions. The lead frames can be thinner at least at the bent regions of the lead frames and can be relatively thicker at other regions of the lead frames.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

DESCRIPTION OF THE DRAWINGS

The above and other aspects, features and advantages of the present invention will become more apparent from the following detailed description when taken in conjunction with the accompanying drawings, in which.

DESCRIPTION OF PREFERRED EMBODIMENTS

Preferred embodiments of the present invention will be described below in detail with reference to FIGS. 1 to 3.

It is to be noted that while the embodiments described below are preferred specific examples of the present invention and therefore have various technically preferred features, the present invention is not limited thereto.

Figure 1:
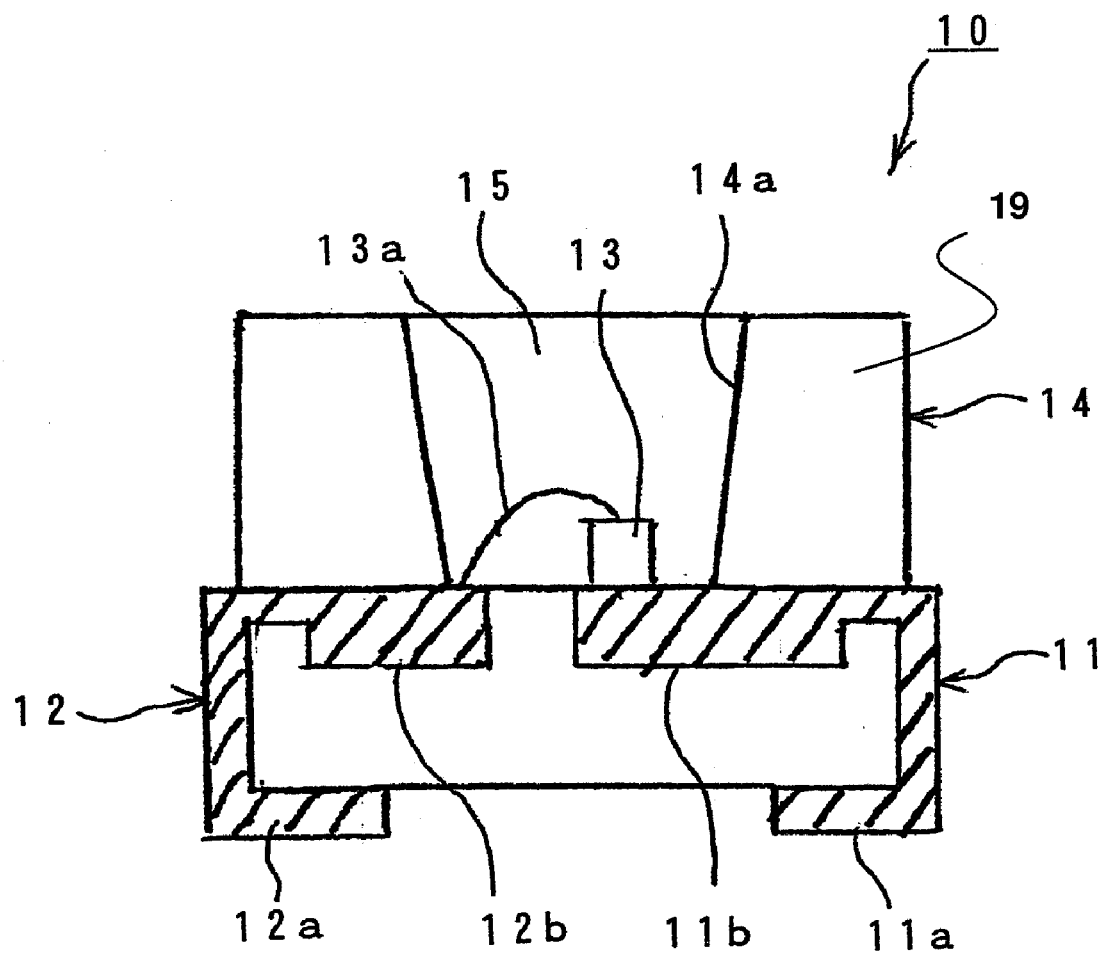
FIG. 1 is a sectional view showing a configuration of an embodiment of a surface mount type LED made in accordance with the principles of the present invention.
Figure 2:
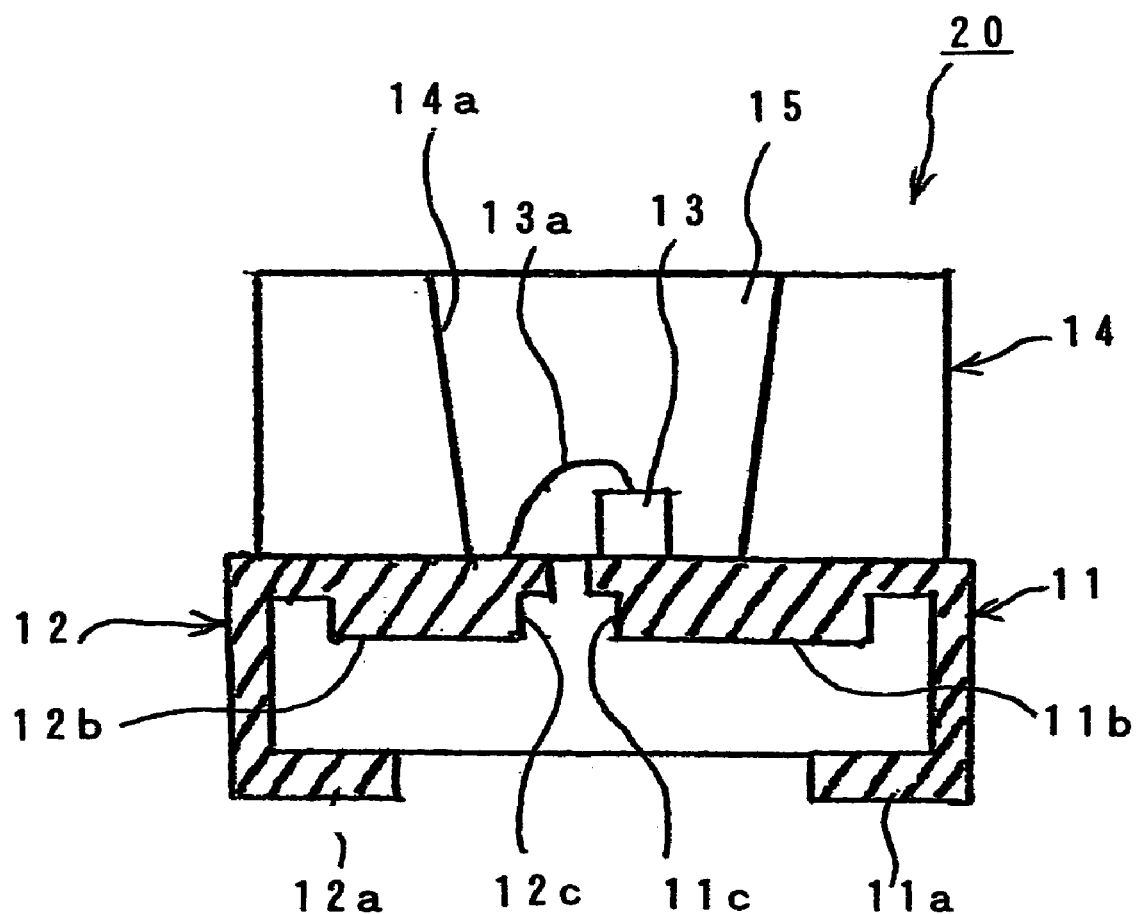
FIG. 2 is a sectional view showing a configuration of another embodiment of a surface mount type LED made in accordance with the principles of the present invention.
Figure 3:
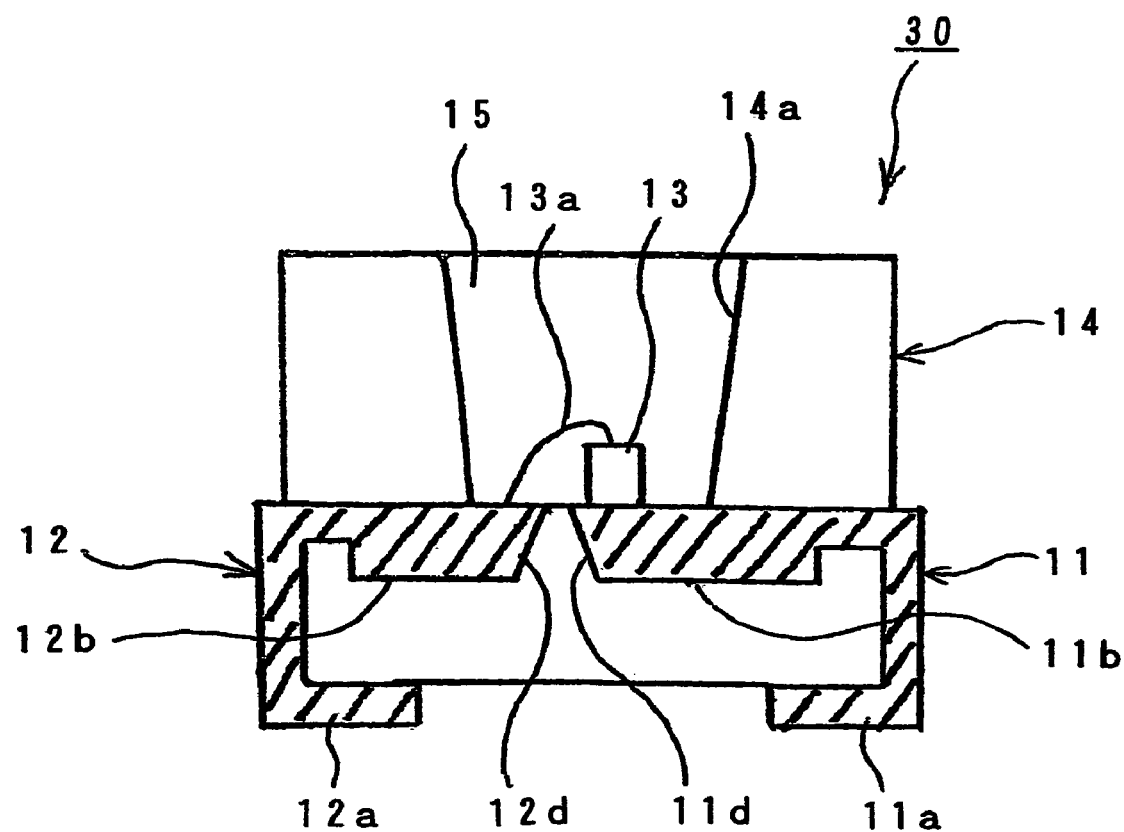
FIG. 3 is a sectional view showing a configuration of another embodiment of a surface mount type LED made in accordance with the principles of the present invention.
Figure 4:
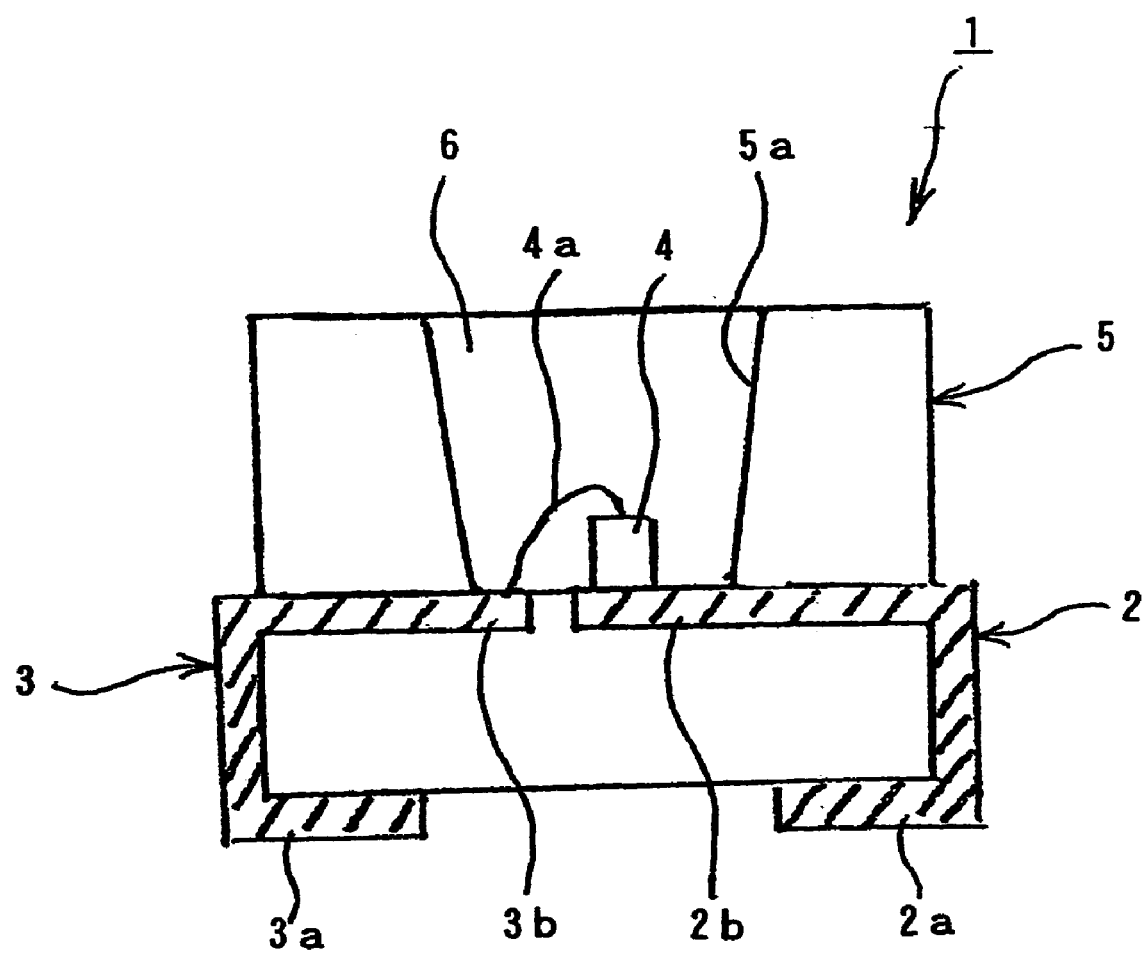
FIG. 4 is a sectional view showing the configuration of an example of a conventional surface mount type LED.
Figure 5:
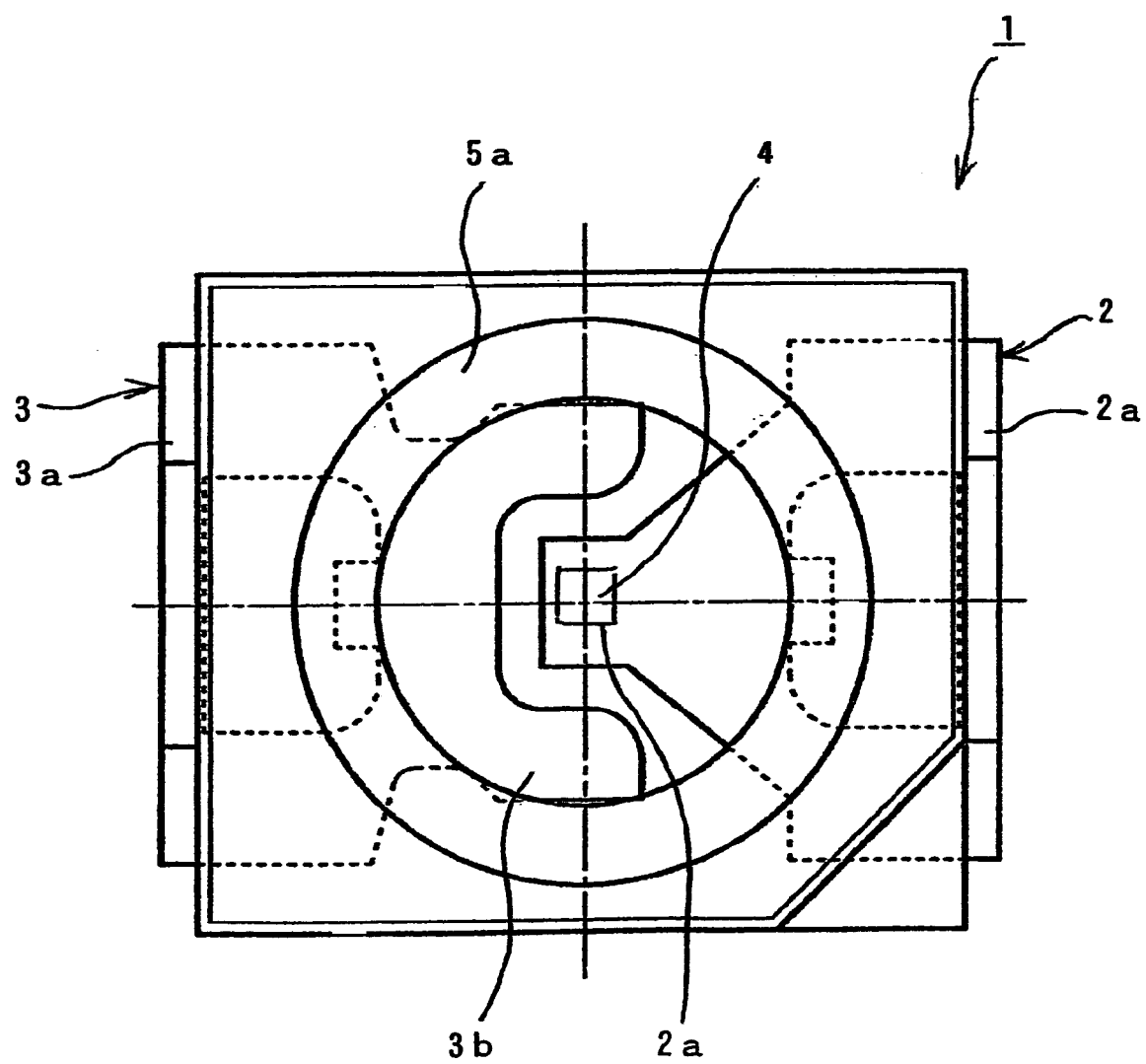
FIG. 5 is a plan view of the surface mount type LED of FIG. 4.
Figure 6:
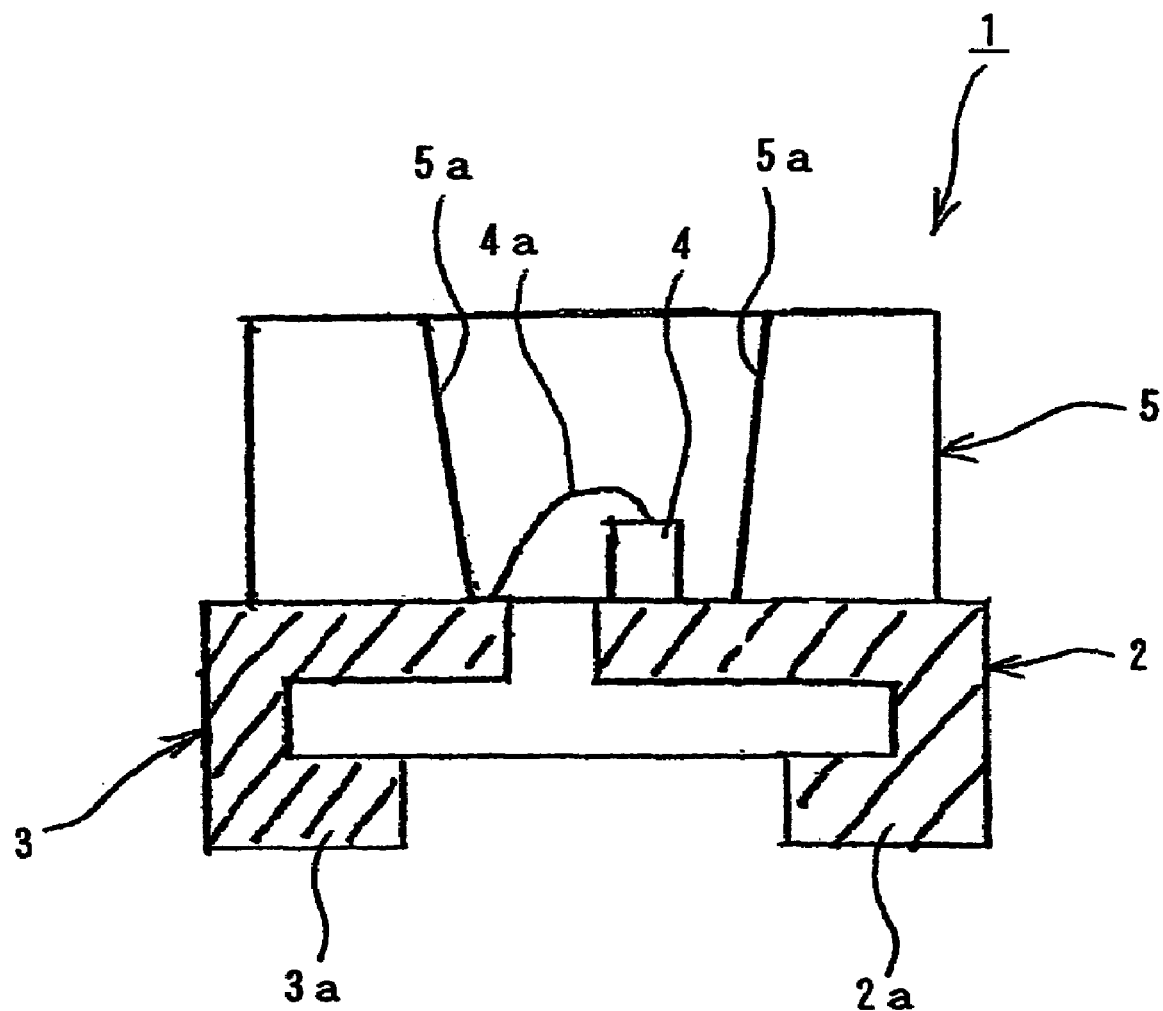
FIG. 6 is a sectional view showing the configuration of another example of a conventional surface mount type LED.

FIGS. 1 to 3 show the configuration of various embodiments of a surface mount type LED made in accordance with the principle of the present invention.

In FIG. 1, a surface mount type LED 10 can include a pair of lead frames 11 and 12, an LED chip 13 mounted on the lead frame 11, a hollow lamphouse 14 configured as a housing 19 that is preferably insert-molded to the lead frames 11 and 12. A sealing resin 15 can be filled into a hollow portion 14a of the lamphouse 14.

The lead frames 11 and 12, can each be made of a conductive material such as iron- or copper-based metal, and can be provided with surface mounting terminal portions 11a and 12a that can be exposed on the bottom and side surfaces of the lamphouse 14.

The lead frame 11 is preferably provided with a chip mount portion 11b that is exposed inside the hollow portion 14a at the center region of the lamphouse 14. The lead frame 12 is preferably provided with a connection portion 12b that is adjacent to the chip mount portion 11b and exposed inside the hollow portion 14a of the lamphouse 14. The terminal portions 11a and 12a can be formed respectively from the chip mount portion 11b and the connection portion 12b.

The LED chip 13 can have its bottom surface die-bonded to the chip mount portion 11b of the lead frame 11 and its front surface (top surface in FIG. 1) wire-bonded to the connection portion 12b of the adjacent other lead frame 12 via a gold wire 13a.

The lamphouse 14 can be insert-molded to the lead frames 11 and 12, for example, by resin, and can be provided with a hollow portion 14a that is open upward. This allows the inner surface of the hollow portion 14a of the lamphouse 14 to constitute a reflecting frame for the LED chip 13.

Within the hollow portion 14a, the chip mount portion 11b of the lead frame 11 and the connection portion 12b of the lead frame 12 can be partially exposed. The sealing resin 15, preferably made of a silicon-based thermosetting resin, etc., is filled into the hollow portion 14a of the lamphouse 14 and hardened. The lead frames 11 and 12 are preferably subjected to forming after filling and hardening of the sealing resin 15, thus forming the terminal portions 11a and 12a.

The surface mount type LED 10 according to the above described embodiment of the invention includes lead frames 11 and 12 that can be made thicker as a whole as compared to conventional lead frames (except for the regions to be bent during forming).

When a drive voltage is applied to the LED chip 13 from the terminal portions 11a and 12a of the lead frames 11 and 12, the LED chip 13 emits light. This light can be reflected by the inner surface of the hollow portion 14a of the lamphouse 14 and simultaneously emitted externally through the sealing resin 15, thus being radiated upward.

The individual lead frames 11 and 12 can be formed thick as a whole, thus boosting their volumes. This secures a sufficient volume for the individual lead frames 11 and 12 even if the semiconductor package of the surface mount type LED 10 is small in size (and therefore the lead frames 11 and 12 are relatively small in area).

The above-described structures can in some instances lead to improved heat radiating effect for the lead frames 11 and 12. Efficient radiation of heat generated during the operation of the LED chip 13 mounted on the chip mount portion 11b of the lead frame 11 can also be achieved.

The lead frames 11 and 12 can be thinly formed at the regions that are to be bent during the forming process, thus keeping stress that occurs during forming relatively small and considerably reducing the likelihood of cracking or otherwise damaging the lamphouse 14 that is molded to the lead frames 11 and 12.

FIG. 2 shows a configuration of another embodiment of a surface mount type LED made in accordance with the principles of the present invention. In FIG. 2, the surface mount type LED 20 is similar in configuration to the surface mount type LED 10 shown in FIG. 1 in some aspects, and accordingly the same elements are assigned the same symbols, and explanation of similar or identical elements will be omitted.

The surface mount type LED 20 can include lead frames 11 and 12 that are provided with stepped portions 11c and 12c at the regions of the mutually-opposing end surfaces and on the rear surface of the mutually-opposing end surfaces. The stepped portions allow these regions to be further thinned.

The surface mount type LED 20 thus configured can function in approximately the same manner as the surface mount type LED 10 shown in FIG. 1. The lead frames 11 and 12 can be formed thinner at the mutually-opposing end surfaces due to the stepped portions 11c and 12c, thus possibly reducing the spacing therebetween close to the thin thickness of the stepped portions 11c and 12c. This makes it possible to further downsize the overall package of the surface mount type LED 20.

FIG. 3 shows the configuration of yet another embodiment of a surface mount type LED made in accordance with the principles of the present invention. In FIG. 3, the surface mount type LED 30 is similar to the surface mount type LED 20 shown in FIG. 2 in some aspects, and accordingly the same elements are assigned the same symbols, and explanation of the same or similar elements will be omitted.

The surface mount type LED 30 can include lead frames 11 and 12 that are provided with sloped portions 11d and 12d instead of the stepped portions 11c and 12c at the regions of the mutually-opposing end surfaces and on the rear surface of the mutually-opposing end surfaces. Thus, these regions can be formed to be thin. The surface mount type LED 30 thus configured can function in the same manner as the surface mount type LED 10 shown in FIG. 1, and the lead frames 11 and 12 can be formed such that they are thin at the mutually-opposing end surfaces due to the sloped portions 11d and 12d, possibly reducing the spacing therebetween. This makes it possible to further downsize the overall package of the surface mount type LED 30.

While the above description relates to embodiments in which the present invention is applied to the surface mount type LEDs 10, 20 and 30, the present invention is not limited thereto. It should be apparent that the present invention is applicable to other semiconductor devices such as ICs and other devices, especially devices that generate heat during operation.

Improved heat radiating effect can be achieved in a semiconductor device even as its volume is increased by forming the lead frames thick except for the regions to be bent during forming procedures, even if the area remains unchanged. The lead frames can be formed to be thin at the regions that are to be bent during the forming procedure, thus reducing stress occurring during forming, and preventing damage such as cracking to the housing that is molded to the lead frames. The invention is applicable to various semiconductor devices, including those that incorporate elements such as IC's, lasers, diodes or bare chips and other devices that generate heat during operation.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art. For example, the stepped portion and the sloped portion can be differently configured to provide a narrowing or thinner portion at the lead frame ends. Specifically, other shapes, such as a curved or zig-zag shapes can be used to effect the narrowing of either the ends of the lead frames or the generally thinner portions. In addition, different methods of manufacture can be used to make the device and frame structure, such as insert molding, resin molding, and other processes. In addition, the ends of the lead frames do not have to be butted exactly in orientation with each other, but can be butted opposite to each other such that there is some play in alignment, provided the alignment does not disturb manufacturability of the device.

What is claimed is:

1. A surface mount type semiconductor device comprising:
    a pair of lead frames having a first end and a second end that are spaced from each other and that are butted opposite to each other, the first end having a chip mount portion and the second end having a connection portion;
    a chip that is mounted on the chip mount portion and wire-bonded to the connection portion; and
    a housing that is molded to the lead frames, wherein
    the lead frames are shaped such that they extend along a bottom surface of the housing and form surface mounting terminal portions,
    the lead frames are thinner at least at regions that are bent, and are relatively thicker at other regions, and at least one of the thinner regions of the lead frames is bent such that it extends in a first direction that is substantially perpendicular with respect to at least one of the chip mount portion and the connection portion, and
    the first end of the lead frames has a first end rear surface located opposite a top surface of the chip mount portion, and the second end of the lead frames has a second end rear surface located opposite a top surface of the connection portion, and at least one of the first end rear surface and second end rear surface includes a thinner portion that is thinner than the thicker other regions of the lead frames, and the at least one of the first end rear surface and second end rear surface includes a first surface portion and a second surface portion, the first surface portion being located at a different location with respect to the first direction than the respective second surface portion.

2. The surface mount type semiconductor device according to claim 1, wherein the lead frames include a stepped portion at at least one of the rear surfaces.

3. The surface mount type semiconductor device according to claim 2, wherein the stepped portion is located on both rear surfaces.

4. The surface mount type semiconductor device according to claim 1, wherein the lead frames include a sloped portion at at least one of the rear surfaces.

5. The surface mount type semiconductor device according to claim 4, wherein the sloped portion is located on both rear surfaces.

6. The surface mount type semiconductor device according to claim 1, wherein the housing is insert molded to the lead frames.

7. The surface mount type semiconductor device according to claim 1, wherein the thicker other regions of the lead frames improves a heat radiating effect of the lead frames.

8. The surface mount type semiconductor device according to claim 1, wherein the chip is a bare chip mounted to the chip mount portion.

9. The surface mount type semiconductor device according to claim 1, wherein the lead frames extend along a side surface of the housing.

10. A lead frame structure comprising:
    a pair of lead frames that include a first end and a second end and that are butted to each other with a spacing such that the first and second ends of the lead frames are located opposite to each other, the lead frames including a chip mount portion located at the first end of the lead frames, and a connection portion located at the second end of the lead frames;
    a chip mounted on the chip mount portion and wire-bonded to the connection portion; and
    a housing adjacent to the lead frames, wherein the lead frames include bent regions such that the lead frames extend along a bottom surface of the housing and include surface mounting terminal portions, and
    the lead frames are thinner at least at the bent regions of the lead frames and are relatively thicker at other regions of the lead frames, and wherein a space exists between the first end and the second end, and the first end is thinner at a location adjacent the space and becomes relatively thicker at a location further from the space.

11. The lead frame structure according to claim 10, wherein the lead frames include a first end rear surface located opposite the chip mount portion, and a second end rear surface located opposite the connection portion, and at least one of the first end rear surface and second end rear surface includes a thinner portion that is thinner than the thicker other regions of the lead frames.

12. The lead frame structure according to claim 11, wherein the lead frames include a stepped portion at one of the rear surfaces.

13. The lead frame structure according to claim 12, wherein the stepped portion is located on both rear surfaces.

14. The lead frame structure according to claim 11, wherein the lead frames include a sloped portion at one of the rear surfaces.

15. The lead frame structure according to claim 14, wherein the sloped portion is located on both rear surfaces.

16. The lead frame structure according to claim 10, wherein the housing is insert molded to the lead frames.

17. The lead frame structure according to claim 10, wherein the thicker other regions of the lead frames improves a heat radiating effect of the lead frames.

18. The lead frame structure according to claim 10, wherein the chip is a bare chip mounted to the chip mount portion.

19. The lead frame structure according to claim 10, wherein the lead frames extend along a side surface of the housing.

20. A surface mount type semiconductor device comprising:
    a pair of lead frames having a first end and a second end that are spaced from each other and that are butted opposite to each other, the first end having a chip mount portion and the second end having a connection portion;
    a chip that is mounted on the chip mount portion and wire-bonded to the connection portion; and
    a housing that is molded to the lead frames, wherein
    the lead frames are shaped such that they extend along a bottom surface of the housing and form surface mounting terminal portions,
    the lead frames are thinner at least at regions that are bent, and are relatively thicker at other regions, and
    the first end of the lead frames has a first end rear surface located opposite the chip mount portion, and the second end of the lead frames has a second end rear surface located opposite the connection portion, and at least one of the first end rear surface and second end rear surface includes a thinner portion that is thinner than the thicker other regions of the lead frames, wherein a space exists between the first end and the second end, and the first end is thinner at a location adjacent the space and becomes relatively thicker at a location further from the space.

* * * * *